United States Patent
Lee et al.

[11] Patent Number: 5,257,238
[45] Date of Patent: Oct. 26, 1993

[54] DYNAMIC MEMORY HAVING ACCESS TRANSISTOR TURN-OFF STATE

[75] Inventors: Ruojia Lee; Fernando Gonzalez, both of Boise, Id.

[73] Assignee: Micron Technology, Inc., Boise, Id.

[21] Appl. No.: 728,486

[22] Filed: Jul. 11, 1991

[51] Int. Cl.[5] .................... G11C 8/00; H03K 17/687
[52] U.S. Cl. ..................... 365/230.06; 365/189.09; 365/189.11; 307/572
[58] Field of Search .............. 365/230.06, 189.09, 365/189.11, 149; 307/568, 572, 353

[56] References Cited

U.S. PATENT DOCUMENTS

| | | | |
|---|---|---|---|
| 3,731,116 | 5/1973 | Hill | 307/572 |
| 4,583,203 | 4/1986 | Monk | 365/230.06 |
| 4,691,217 | 9/1987 | Ueno et al. | 307/568 |
| 5,119,334 | 6/1992 | Fujii | 365/189.11 |

Primary Examiner—William L. Sikes
Assistant Examiner—Toan Tran
Attorney, Agent, or Firm—Angus C. Fox, III

[57] ABSTRACT

A dynamic memory having improved cell access transistor turn-off state. In order to reduce subthreshold leakage current through cell access devices, the wordline signal voltage is alternates between $V_{CC}$ (the access transistor turn-on voltage) and a negative potential, rather than between $V_{CC}$ and ground potential. By applying a negative potential to the wordline during the period when the cell access transistor is required to be in an "off" state, $V_{GS}$ is made more negative, which results in more complete turn off of the access transistor during the period when the cell capacitor is storing charge. The negative potential replaces ground potential as the pull-down voltage input for signal-inverting wordline drivers. The negative potential may be derived from an existing charge pump used to negatively backbias the substrate, or it may be derived from a dedicated charge pump. However, in order to eliminate the potential problem of current injection, the two negative voltages should be approximately equal. In order to implement the preferred embodiment of this invention, a masked adjustment implant is performed so that the $V_T$ of N-channel cell access transistors within the memory array remains unchanged, while the $V_T$ of the wordline driver N-channel pull-down transistors is raised by an amount substantially equal to $V_{BB}$, the backbias voltage.

11 Claims, 2 Drawing Sheets

DYNAMIC MEMORY HAVING ACCESS TRANSISTOR TURN-OFF STATE

FIELD OF THE INVENTION

This invention relates to semiconductor memory devices and, more particularly, to techniques aimed at improving the sub-threshold leakage characteristics of leakage-sensitive devices such as memory cell access transistors.

BACKGROUND OF THE INVENTION

Within the realm of semiconductor manufacturing technology, the trend toward ever-increasing device density, accompanied by corresponding decreases in device dimensions, seems unlikely to abate in the foreseeable future. Since the late 1960's, a new generation of integrated dynamic random access memory circuits has been developed approximately every four years. Each generation has been characterized by roughly a thirty percent reduction in device dimensions, which has resulted in a two to four-fold density increase over the previous generation.

In order to achieve the aforementioned density increases in dynamic random access memory arrays, circuit designers have had to confront two persistent challenges: that of maintaining adequate memory cell capacitance (in spite of the decreasing wafer surface area available for each cell), and that of minimizing sub-threshold current leakage (brought about by decreasing device channel lengths). In order to maintain adequate cell capacitance, circuit designers have largely forsaken planar cell capacitors, and are relying on increasingly complex, three-dimensional structures to provide additional plate area. In addition, silicon dioxide cell dielectric layers have been displaced by materials which have higher dielectric constants, (e.g., silicon nitride, tantalum pentoxide, and certain ferroelectric compounds). The problem of sub-threshold current leakage, on the other hand, has also been attacked in a number of ways, which will be explained with reference to FIG. 1.

FIG. 1 depicts plots on common axes of $I_{DS}$ (drain-to-source current) vs. $V_{GS}$ (gate voltage minus source voltage) for four representative devices. It should be pointed out that on none of the four plots does $I_{DS}$ start at zero, due to a certain amount of noise inherent in all circuits. The left-most plot A is characteristic of a relatively short-channel transistor, while the right-most plot D is characteristic of a relatively long-channel transistor. One technique that is now frequently used to reduce the short-channel effect is the implantation of an impurity of the opposite conductivity type used for the source and drain junctions as a halo surrounding the source and drain regions. The use of a punchthrough halo implant has the effect of shifting the entire curve from left to right and steepening the slope of the transition portion thereof. For example, a transistor with a somewhat short-channel effect and no punchthrough implant might produce a plot of $I_{DS}$ vs. $V_{GS}$ such as plot B of FIG. 1. The use of a punchthrough implant might result in a new plot similar to that of plot C. Another technique used to mitigate the short-channel effect is that of backbiasing the substrate with a charge pump to a negative potential. Backbiasing results in improved transistor shut-off characteristics, due to what is known as the transistor body effect. The transistor body effect tends to shift the $V_{GS}$ vs. $I_{DS}$ curve to the right and steepening the slope of its transition portion. Backbiasing of the substrate has its limitations. Due to the fact that $V_T$ (transistor threshold voltage) does not increase linearly with respect to negative increases in $V_{BB}$ due to transistor channel doping profile, one rapidly reaches the point of diminishing returns. Additionally, junction breakdown voltage is decreased through a backbiasing of the substrate. Consequently, substrate backbias voltages are typically no more negative than several volts. A third technique used to reduce the short-channel effect is the use of "smart sense amplifiers" on array bitlines. Such sense amps prevent the bitline from being pulled all the way to ground level during the period when a wordline is not activated, thereby decreasing both $V_{GS}$ and sub-threshold current leakage. However, as the bitline voltage is increased, signal strength suffers during read operations—especially in the case where charge has been stored within the cell capacitor. Consequently, the maximum pull-down voltage for bitlines used with smart sense amps is around 0.5 volts. The effect of increasing the bitline pull-down voltage is somewhat similar to the effect produced by the previously discussed techniques. Not only is the curve shifted to the right, but the "off" point on the curve is shifted down and to the left. For example, in the case of curve A (the plot showing an extreme short-channel effect), a rise in bitline pull-down voltage to 0.5 volts would result in a $V_{GS}$ value of $-0.5$ volts (point 11 on plot A). Although current flow has been reduced from the point where $V_{GS}$ is equal to zero (point 12 on plot A), significant subthreshold leakage would still occur, as the current flow level is far from the minimum value which corresponds to the average noise level value (represented by broken line 13). A fourth technique that is commonly used to reduce the short-channel effect is that of using a threshold voltage adjustment implant. For N-channel devices, boron is generally the preferred implant impurity. Once again, the use of this technique has its downside. As concentration of the $V_T$ adjustment implant increases, signal strength suffers during read operations as the voltage differential between the capacitor plates decreases as the $V_T$ adjustment implant concentration increases.

What is needed is an additional technique for reducing short-channel effect that does not hamper transistor or array function, which can be easily implemented given presently-available array architectures, and which can be used in combination with the techniques for mitigating short-channel effect that have been heretofore described.

SUMMARY OF THE INVENTION

This invention provides a method and circuitry for improving the turn-off state characteristics of a dynamic memory cell access transistor, which fulfills the requirements listed in the foregoing paragraph. The basic concept is that of having the wordline signal voltage alternate between $V_{CC}$ (the access transistor turn-on voltage) and a negative potential, rather than between $V_{CC}$ and ground potential. By applying a negative potential to the wordline during the period when the cell access transistor is required to be in an "off" state, $V_{GS}$ is made more negative, which (referring once again to FIG. 1) moves the point on the $I_{DS}$ vs. $V_{GS}$ curve to the left, resulting in more complete turn off of the access transistor during the period when the cell capacitor is storing charge.

A comparison of a DRAM array constructed in the manner of this invention with contemporary DRAM arrays is instructional. In contemporary DRAM arrays having conventional sense amps, both gate voltage and source voltage are typically at ground potential when the associated wordline is not selected (i.e., the timing control signal is low). Hence, $V_{GS}$ (the difference between gate and source voltages) is 0. However, if smart sense amps are utilized in the array, gate voltage is still at ground potential, while source voltage would be roughly 0.5 volts. In such a case, $V_{GS}$ will equal (0-0.5) volts, or −0.5 volts. For an array constructed in the manner of the present invention, a designer may wish to couple the pull-down voltage of wordline drivers to the substrate in order to take advantage of an existing negative backbias voltage ($V_{BB}$) generated by a primary charge pump. Therefore, a typical low voltage on the wordlines, during the period when the cells of that row are not being accessed, might be −1.5 volts. In such a case, $V_{GS}$ would be approximately equal to −1.5 volts if conventional sense amps were used, and approximately −2.0 volts if smart sense amps were utilized.

Of course, it is not necessary that the negative potential for wordlines be generated by the primary charge pump used to backbias the substrate. The negative potential may be generated by a secondary charge pump that is completely independent of the primary pump. However, to eliminate the potential problem of injecting current from wordline driver transistor junctions into the substrate, or from the substrate into the wordline driver junctions, the two negative voltages should be substantially equal.

In any case, it will be necessary to perform a threshold voltage adjustment implant on the wordline driver N-channel pull-down transistor so that it will turn off when the wordline driver input is low (generally ground potential). A masked adjustment implant is performed so that the $V_T$ of N-channel cell access transistors within the memory array remains unchanged, while the $V_T$ of the wordline driver N-channel pull-down transistors is raised by an amount substantially equal to $V_{BB}$, the backbias voltage.

PREFERRED EMBODIMENT OF THE INVENTION

By having the wordline signal voltage within a dynamic random access memory array alternate between $V_{CC}$ (the access transistor turn-on voltage) and a negative potential, rather than between $V_{CC}$ and ground potential, a more complete sub-threshold turn off of array cell access transistors is achieved. Such a scheme permits further reduction in access transistor channel length and, hence greater circuit density, and results in improved sense amp signal strength, longer refresh times, and an improved soft error rate.

Figure 1:
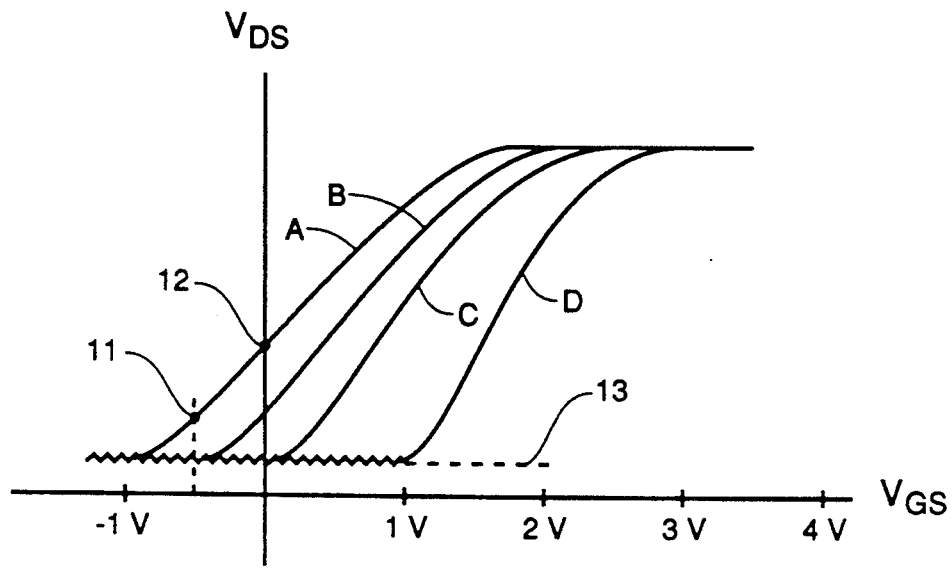
FIG. 1 shows plots on common axes of $I_{DS}$ (drain-to-source current) vs. $V_{GS}$ (gate voltage minus source voltage) for four representative devices.
Figure 2:
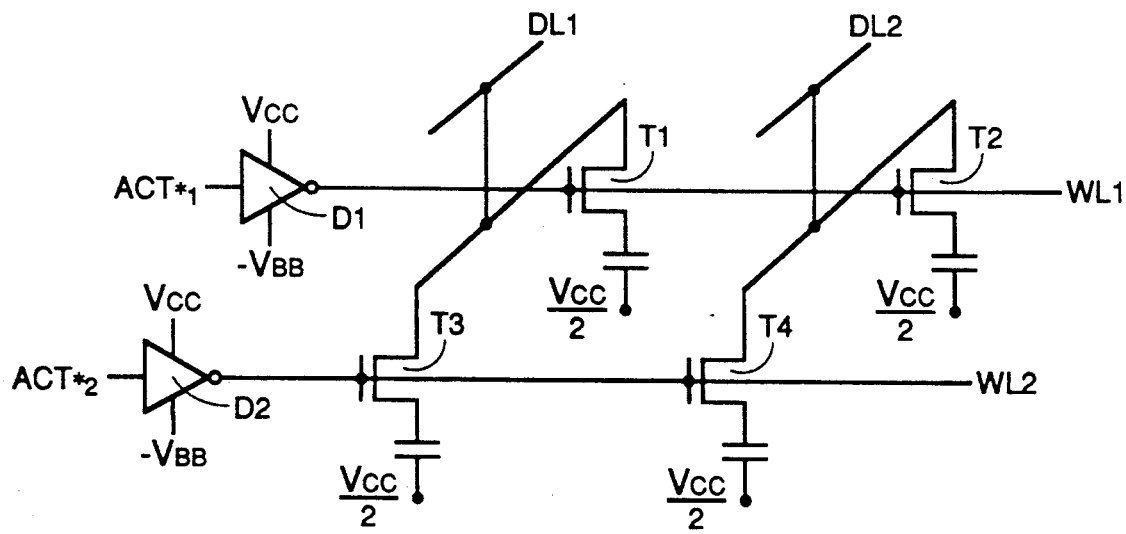
FIG. 2 depicts four memory cells, a pair of digitlines, and a pair of wordlines and associated wordline drivers within a small portion of a dynamic random access memory array.
Figure 3:
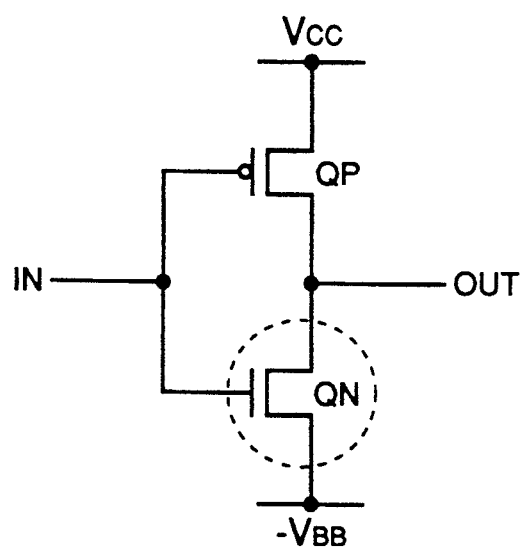
FIG. 3 depicts a schematic diagram of the wordline drivers depicted in FIG. 2.

Referring now to FIG. 2, a DRAM array portion, constructed in accordance with the present invention, is shown. A pair of signal-inverting wordline drivers D1 and D2, which are located in the array periphery, are also depicted. The input of driver D1 is coupled to a first refresh activation signal ACT*$_1$, while its output is coupled to wordline WL1. The input of driver D2 is coupled to a second refresh activation signal ACT*$_2$, which (depending on the refresh scheme) may or may not be the same as signal ACT$_1$, and the output of driver D2 is coupled to wordline WL2. In this small array portion, the gates of a first pair of cell access transistors T1 and T2 are formed by wordline WL1, while the gates of a second pair of cell access transistors T3 and T4 are formed by wordline WL2. Transistors T1 and T3 share digitline DL1, while transistors T2 and T4 share digitline DL2. The wordline drivers D1 and D2 are the key to this invention. In a conventional DRAM circuit, $V_{CC}$ and ground are alternately coupled to wordlines through their respective drivers, while in the array fabricated in accordance with the present invention, $V_{CC}$ and a negative potential (e.g., backbias voltage $V_{BB}$) are alternately coupled to a wordlines through their respective drivers. The negative potential turns off short-channel access transistors much more effectively than ground potential. The wordline drivers depicted in FIG. 2 as features D1 and D2 are represented schematically in FIG. 3. When the contents of the cells which are accessed by a particular wordline are to be read or refreshed, that particular wordline is turned on (i.e., activated) by sending the appropriate activation signal ACT* (see the discussion of activation signals in the preceding discussion of FIG. 2) to the input IN of the inverting driver associated with that wordline. The asterisk (*) in the activation signal symbol ACT* connotes that this signal is active when low. Driver input IN is coupled to both the gate of a P-channel field-effect transistor QP and the gate of an N-channel transistor QN. The wordline driver output OUT is coupled to a wordline (not shown in this Figure), to $V_{CC}$ through P-channel transistor QP, and to a negative voltage potential (e.g. $V_{BB}$) through N-channel transistor QN. In order to prevent N-channel transistor from being in an "ON" state when the input to the driver is in the low state (most likely ground potential), the threshold voltage of transistor QN is adjusted with a P-type impurity implant, such as boron, during its fabrication so that $V_T$ is at least equal to the absolute value of the negative voltage applied to transistor QN (in this case $V_{BB}$) plus approximately 0.8 volts (a relatively standard threshold voltage value for N-channel devices in conventional memory arrays). The broken circular line surrounding transistor QN is intended to indicate that this transistor has an adjusted threshold voltage.

Although only two embodiments of this invention have been described herein, it will be obvious to those having ordinary skill in the art of semiconductor memory fabrication, that changes and modifications may be made thereto without departing from the scope and spirit of the invention as claimed. For example, this invention could be easily applied to a bipolar-CMOS DRAM array by utilizing drivers having bipolar pull-up and pull-down transistors. Therefore driver transistor control elements may be either (in the case of field-effect transistors) gates or (in the case of bipolar transistors) the bases. Another obvious and equivalent implementation of the invention applies to the case where the array comprises P-channel access devices. In such a case, a like effect could be obtained by alternating wordline voltage between ground potential and a potential greater than $V_{CC}$, which is the cell access transistor turn-off voltage.

We claim:

1. A dynamic random access memory comprising:
   a) a plurality of wordlines;
   b) a plurality of bitlines which intersect said plurality of wordlines;
   c) a plurality of memory cells, the location of each corresponding to the intersection of a single wordline and a single bitline which are associated with that particular cell, each cell having a capacitor for storing a bit of information represented by charge or no charge thereon, an access transistor gated by its associated wordline through which the cell's capacitor may accessed for charging or discharging for the purpose of reading, writing or refresh;
   d) a signal-inverting driver for each wordline, each driver having a first-conduction-type driver transistor, a second-conduction-type driver transistor, an input coupled to the control elements of both driver transistors for the receipt of a timing control signal, an output coupled to 1) the driver's associated wordline, 2) to a first voltage at least equal to the threshold voltage of the access transistors through the first-conduction-type driver transistor, and 3) to a second voltage having a polarity opposite to that of said first voltage through the second-conduction-type driver transistor, said timing control signal being in a high state during the period when the capacitors of memory cells associated with that particular wordline are not being accessed, and being in a low state during the period when the capacitors of memory cells associated with that particular wordline are being accessed.

2. The dynamic random access memory of claim 1, wherein said access transistors are N-channel field-effect transistors, each of said first-conduction-type transistors is a P-channel field-effect transistor, each of said second-conduction-type transistors is an N-channel field-effect transistor, and said first voltage is characterized by positive polarity.

3. The dynamic random access memory of claim 2, wherein said memory cells are constructed on a substrate to which a negative voltage is applied such that it is back-biased with respect to the source of each access transistor.

4. The dynamic random access memory of claim 3, wherein said second voltage is substantially equal to said negative voltage applied to the substrate.

5. The dynamic random access memory of claim 4, wherein said voltage applied to the substrate and said second voltage are supplied by a single charge pump.

6. The dynamic random access memory of claim 4, wherein said voltage applied to the substrate and said second voltage are supplied by separate charge pumps.

7. The dynamic random access memory of claim 4, wherein said low state of said timing control signal is substantially equal to ground potential.

8. The dynamic random access memory of claim 7, wherein N-channel driver transistors are subjected to a threshold voltage adjustment implant during fabrication such that their average threshold voltage is higher than the average threshold voltage of the N-channel access transistors.

9. The dynamic random access memory of claim 8, wherein the average threshold voltage of the N-channel driver transistors is greater than the average threshold voltage of the N-channel access transistors by an amount approximately equal to the absolute value of said second voltage.

10. A method for increasing the off-state impedance of N-channel cell access transistors within a dynamic memory array, each of said cell access transistors having a gate that is coupled to a wordline, said method being performed by varying a signal voltage applied to wordlines between a positive potential at least equal to the threshold voltage of the cell access transistors and a negative potential that is always less than a range of voltages that is applied to the source of each access transistor during "off" states, said varying of the signal voltage between said positive potential and said negative potential being accomplished by coupling each wordline to the output of a driver that is responsive to a timing control signal.

11. The method of claim 10, wherein said driver is constructed by coupling a P-channel field-effect transistor between the positive voltage and the wordline, coupling an N-channel field-effect transistor between the negative voltage and the wordline, and coupling the timing control signal to the gates of both transistors.

* * * * *